United States Patent
Wu et al.

(10) Patent No.: US 7,408,361 B2
(45) Date of Patent: Aug. 5, 2008

(54) DETECTION CIRCUIT FOR MEASUREMENT OF TEST LEAD AND USING THE SAME

(75) Inventors: James Wu, Taipei (TW); Larry Tsai, Taipei (TW); Winston Hsiao, Taipei (TW)

(73) Assignee: Escort Instruments Corporation, Hsin-Tien Taipei (TW)

( * ) Notice: Subject to any disclaimer, the term of this patent is extended or adjusted under 35 U.S.C. 154(b) by 0 days.

(21) Appl. No.: 11/546,920

(22) Filed: Oct. 13, 2006

(65) Prior Publication Data

US 2008/0088317 A1    Apr. 17, 2008

(30) Foreign Application Priority Data

Jul. 12, 2006    (TW) ............... 95125554 A

(51) Int. Cl.
*G01R 31/08*    (2006.01)
*G01R 31/04*    (2006.01)

(52) U.S. Cl. ...................... 324/527; 324/538
(58) Field of Classification Search ........... 324/527, 324/512, 500, 503, 507, 508, 509, 526, 538, 324/539, 543, 550, 506, 756, 761; 439/638, 439/676, 862
See application file for complete search history.

(56) References Cited

U.S. PATENT DOCUMENTS

| | | | | |
|---|---|---|---|---|
| 3,775,677 A | * | 11/1973 | Garrett et al. | 324/506 |
| 3,927,404 A | * | 12/1975 | Cooper | 340/518 |
| 5,477,152 A | * | 12/1995 | Hayhurst | 324/542 |
| 6,188,560 B1 | * | 2/2001 | Waas | 361/119 |
| 2003/0141878 A1 | * | 7/2003 | Shinzou et al. | 324/539 |

FOREIGN PATENT DOCUMENTS

JP    05060799 A    *    3/1993

* cited by examiner

*Primary Examiner*—Vincent Q. Nguyen
*Assistant Examiner*—Hoai-An D Nguyen
(74) *Attorney, Agent, or Firm*—Birch Stewart Kolasch & Birch, LLP

(57) ABSTRACT

A detecting method of a detecting circuit with a plugged test lead. The method includes setting an operation mode of the detecting circuit by a recognizing unit, transmitting a signal to the recognizing unit by an oscillating unit when the test lead plugs or unplugs into a split contact jack, receiving the signal from the oscillating unit by the recognizing unit, and determining a condition of the detecting circuit, and sending a message to a user in accordance with the determining result of the recognizing unit. Further, the oscillating unit is stopped from oscillating and outputs a quiescent state voltage to the recognizing unit when the plugged test lead is inserted into the split contact jack.

6 Claims, 6 Drawing Sheets

(HIGH LEVEL)

(LOW LEVEL)

DETECTION CIRCUIT FOR MEASUREMENT OF TEST LEAD AND USING THE SAME

TECHNICAL FIELD

The present invention relates to electrically measuring instruments, and more particularly, to test lead detecting circuits.

BACKGROUND

In various electrically measuring instruments, test leads are needed to couple to the measuring instrument so as to connect to a DUT (device under test) for measuring. Typical test lead includes two terminals, one terminal coupled to a DUT (device under test), and another terminal inserted into receptacles of the electrically measuring measurement so that physical quantities, for example voltage, current and power, measured by the DUT (device under test) are transmitted to the electrically measuring instrument through the test lead in order to measure for acquiring the data of the physical quantities. Generally speaking, an electrical measuring instrument has multiple receptacles used to measure different physical quantities. For example, one set of the receptacles is employed during a voltage measuring and another set of the receptacles is used during a current measuring. Because impedance of the measurement circuitry connected to the current measurement receptacle is very low, applying a large voltage to the current measurement receptacle may result in an extremely high currents flowing through the current measurement circuitry thereby causing the electrically measuring instrument being damaged or destroyed.

SUMMARY OF THE INVENTION

The present invention disclosed a detecting circuit with a plugged test lead for detecting the contacting condition of a test lead plug which is present in a split jack with contact plates of an electrical measuring instrument or not. The detecting circuit comprises a split contact jack of an electrical measuring instrument, a shunt coupled to ground and the first terminal of the split contact jack, an oscillating unit coupled to the second terminal of the split contact jack through a protecting unit for generating a pulse or a quiescent state output, and a recognizing unit coupled to the oscillating unit for receiving an output signal transmitted from the oscillating unit, and determining a condition of the detecting circuit by utilizing the oscillating unit.

The present invention disclosed also a detecting method of a detecting circuit with a plugged test lead. Firstly, setting an operation mode of the detecting circuit by a recognizing unit is provided. Next, a signal is transmitted to the recognizing unit by an oscillating unit whereas the test lead plugs into a split contact jack. The signal is received from the oscillating unit by the recognizing unit, determining a condition of the detecting circuit. Finally, a message is sent to a user in accordance with the determining result of the recognizing unit.

DETAILED DESCRIPTION

The following embodiments and drawings thereof are described and illustrated in the specification that are meant to be exemplary and illustrative, not limiting in scope. One skilled in the relevant art will identify that the invention may be practiced without one or more of the specific details, not limiting in scope.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
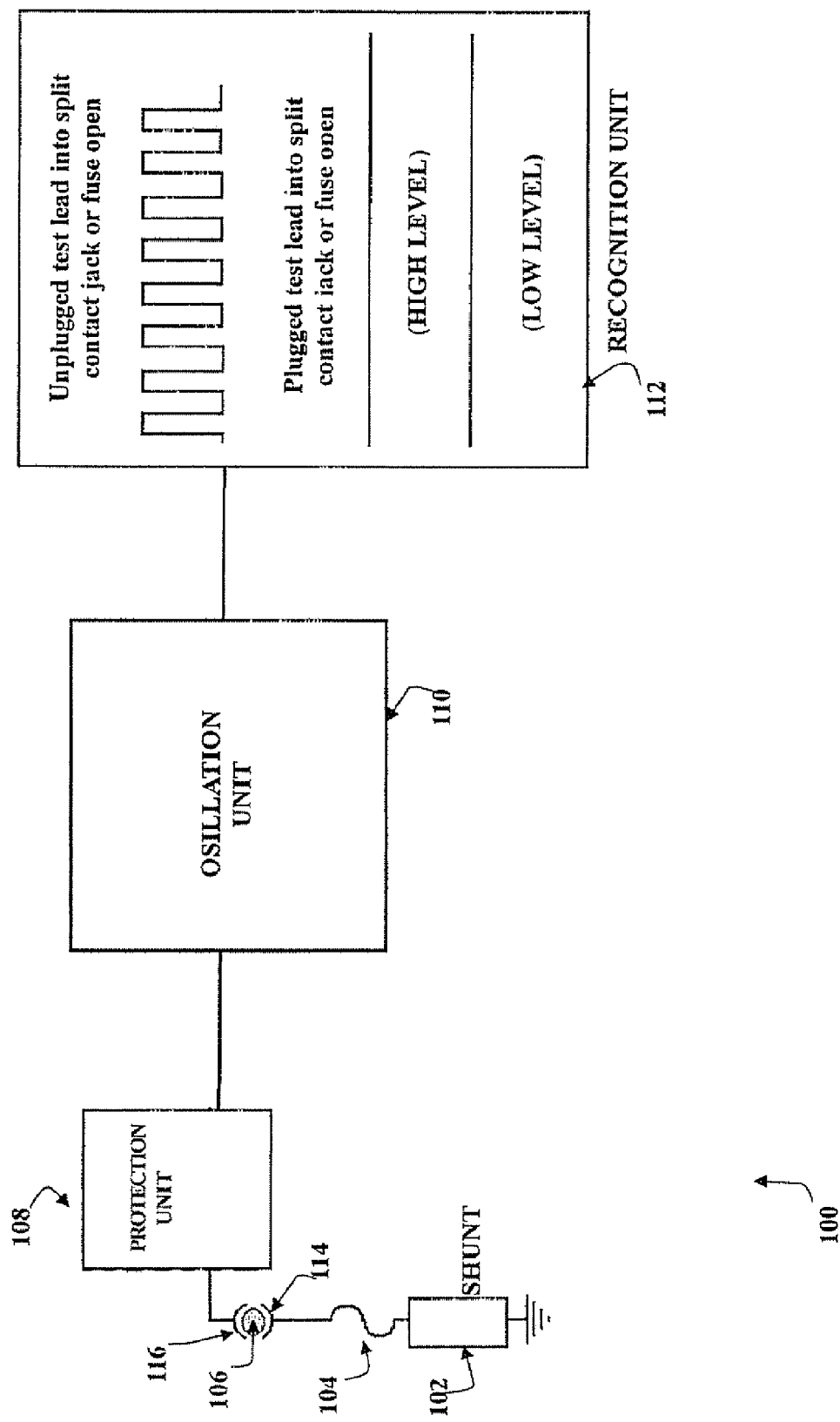
FIG. 1 is a schematic diagram illustrating structure of the plugged test lead detecting circuits in accordance with the present invention.

FIG. 1 depicts a block diagram illustrating a detecting circuit 100 with a plugged test lead in accordance with an embodiment of present invention. The detecting circuit 100 comprises a shunt 102 coupled to ground for bypassing and measuring the current of a DUT (device under test); a oscillating unit 110 used to generate a pulse or a quiescent state output; a recognizing unit 112 coupled to the oscillating unit 110 for receiving a output signal transmitted from the oscillating unit 110, and determining a condition of the detecting circuit 100; a fuse 104 in serial with the shunt 102 to prevent over-current flowing into the shunt 102 through the fuse 104 ; a protecting unit 108 coupled to the oscillating unit 110 having high impedance to prevent error current from the oscillating unit 110 into the shunt 102; a split contact jack 106 with contact plates including two contact plates, the contact plate 114 and contact plate 116. The contact plate 114 is coupled to ground through a series circuit of the fuse 104 and the shunt 102. The contact plate 116 is coupled to the protecting unit 108.

Return to FIG. 1, in one embodiment of the present invention, when the test lead is plugged into the split contact jack 106, the test lead bridges over the contact plate 116 and contact plate 114 to form an electrical path such that the protecting unit 108, the fuse 104 and the shunt 102 form a series circuit to ground. Consequently, the oscillating unit 110 stops oscillating automatically and keeps a quiescent state output to the recognizing unit 112. Conversely, when the test lead does not plug in the split contact jack 106, the contact plate 114 and the contact plate 116 are open, and the oscillating unit 110 generates a pre-determined frequency pulse to the recognizing unit 112. Then, the recognizing unit 112 receives the signal transmitted from the oscillating unit 110 to identify the state of the oscillation unit.

Figure 2:
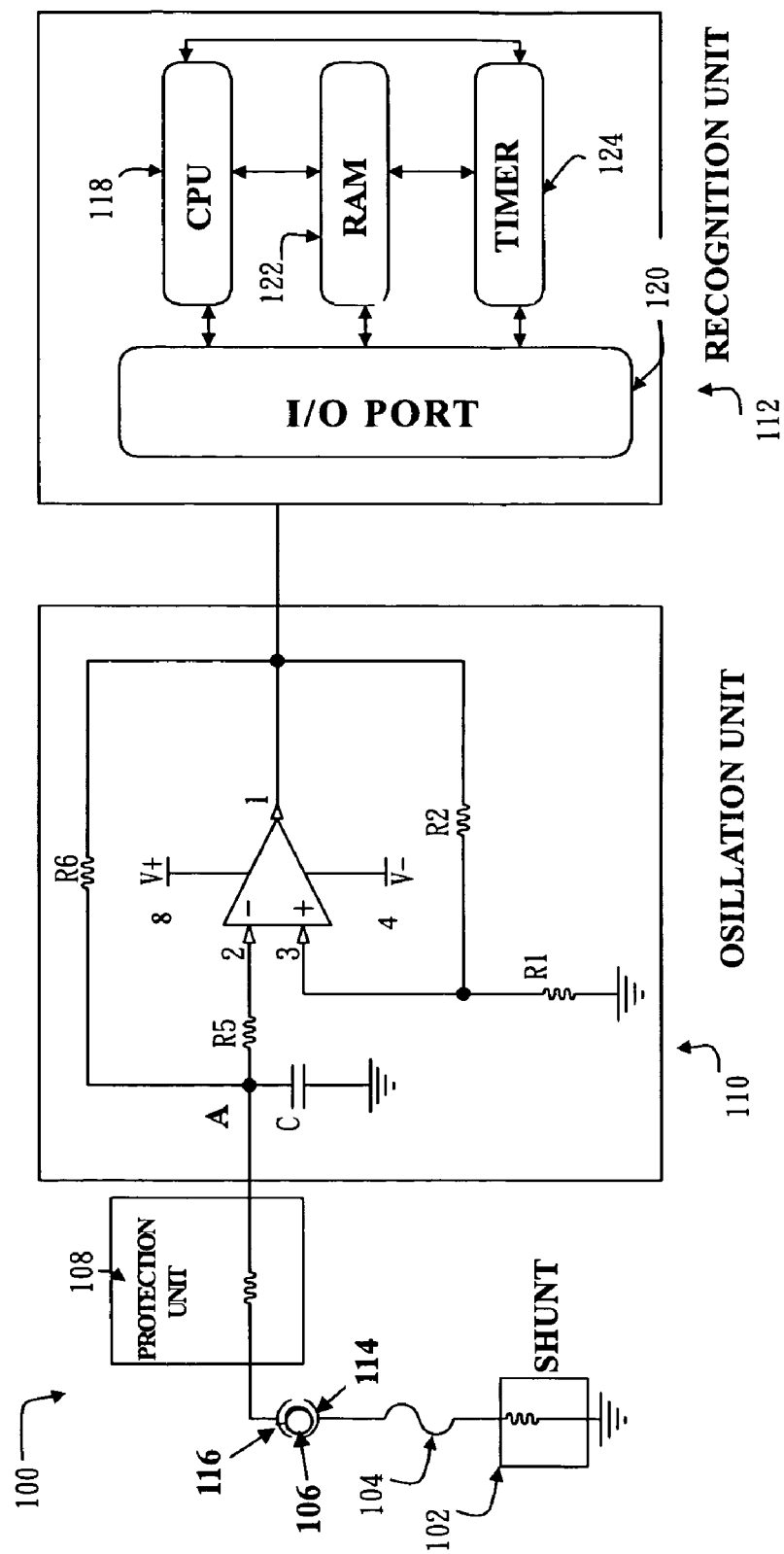
FIG. 2 is a circuitry for use in FIG. 1 in accordance with the present invention.

FIG. 2 is a circuitry for use in FIG. 1 in accordance with an embodiment of the present invention. FIG. 2 depicts in detail the shunt 102, the protecting unit 108, the oscillating unit 110 and recognizing unit 112.

The shunt 102 expounded in FIG. 2 includes a resistor with an extremely little resistance which is neglected in comparison with the impedance of the protecting unit 108. The protecting unit 108 includes a resistor R3 with a high resistance for protecting an unexpected high voltage applied to the split contact jack 106. The oscillating unit 110 includes an oscillating circuit which is consisted of an operational amplifier (OPA), resistors R1, R2, R5, R6 and a capacitor C. The output state of the oscillating circuit is changed alternatively by charging and discharging into and from the resistor R6 and the capacitor C thereby reaching the function of output oscillating signal. The recognizing unit 112 includes a central processing unit (CPU) 118 used to determine the condition of the detecting circuit 100; an input/output port (I/O port) 120 to act as a communicating channel for the central processing unit 118; a Random Access Memory (RAM) 122 (referring as a counter) for counting the duty cycle of the output signal from the oscillating unit 110, and storing the output state of the oscillating unit 110. Subsequently, the counting information is transmitted from the counter 122 to the central processing unit 118 through the I/O port 120. A timer 124 is to pre-set a set time, and then the counter 124 stops counting when the set time is reach, and a message is transmitted to notice the central processing unit 118 through the I/O port 120.

Referring to FIG. 2, firstly, when the test lead does not plug in the split contact jack 106, the contact plate 114 and contact plate 116 are not coupled together. This means that a series circuits constituted by the contact plate 114 connected to the fuse 104, the shunt 102 do not couple to another series circuits constituted by the contact plate 116 coupled to the resistor R3 of the protecting unit 108 such that the detecting circuit is to be open. Therefore, no current created by the oscillating unit 110 flows into the series circuits constituted by the resistor R3, the split contact jack 106, the fuse 104 and the shunt 102 to ground.

Referring to FIG. 2, the terminal 4 of the operational amplifier in the oscillating circuit 110 is applied to a voltage $V_-$, and the terminal 8 of the operational amplifier is applied to a voltage $V_+$. The output terminal 1 of the operational amplifier is outputted voltage $V_o$ which is determined by comparing the voltage $V_c$ between the terminal 2 of the operational amplifier to ground with a reference voltage $V_{ref}$. The reference voltage $V_{ref}$ is the voltage as a function of R1, R2 followed by the equation $$V_{ref} = \frac{R1}{R1+R2} \times V_o.$$

When the test lead does not plug in the split contact jack 106, the output voltage $V_o$ is equal to the voltage $V_+$ of the terminal 8 if the voltage $V_c$ of the capacitor C is equal to zero, and then, the capacitor C is charged until the voltage $V_c$ is greater than the reference voltage $V_{ref}$ through the path from the output terminal of operational amplifier connected to the resistor R6 and capacitor C to ground. Thus, the output voltage $V_o$ of the operational amplifier converted into the voltage $V_-$ so that the capacitor C is discharge and charged inversely according to the path from the output terminal of operational amplifier connected to the resistor R6 and capacitor C to ground until the voltage $V_c$ is less than the reference voltage $V_{ref}$. Consequently, the voltage of the terminal 3 of the operational amplifier is greater than the voltage of the terminal 2 of the operational amplifier so that the output voltage $V_o$ is equal to the voltage $V_+$ to cause the capacitor C to be charged according the above mentioned path. In this way, the output voltage $V_o$ is oscillating alternatively between the voltage $V_+$ and $V_-$.

If the test lead is plugged into the split contact jack 106, the test lead bridges the contact plate 116 and contact plate 114 to form an electrical path through the series circuit constituted by the protecting unit 108, the fuse 104 and the shunt 102 coupled to ground. The output current of the operational amplifier flowing by the resistor R6, capacitor C will flow to the series circuit constituted by the resistor R3, the fuse 104 and the shunt 102 coupled to ground. Thus, the capacitor C stops being charged and discharged alternatively to hold the same potential as a node A, and then the oscillating circuit 110 stops oscillating, and outputs a quiescent state voltage to the recognizing unit 112.

The recognizing unit 112 receives the signal transmitted from the oscillating unit 110 so as to identify the state of the oscillating unit 110. The recognizing unit 112 may utilize an A/D converter or a comparator or the similar device to identify the condition of the detecting circuit 100 through a filter transfer or a level shift. Also, the recognizing unit 112 may utilize frequency, duty cycle or pulse width measured by a measurement device to identify the condition of the detecting circuit 100 by a central processing unit or a microprocessor unit.

Figure 3:
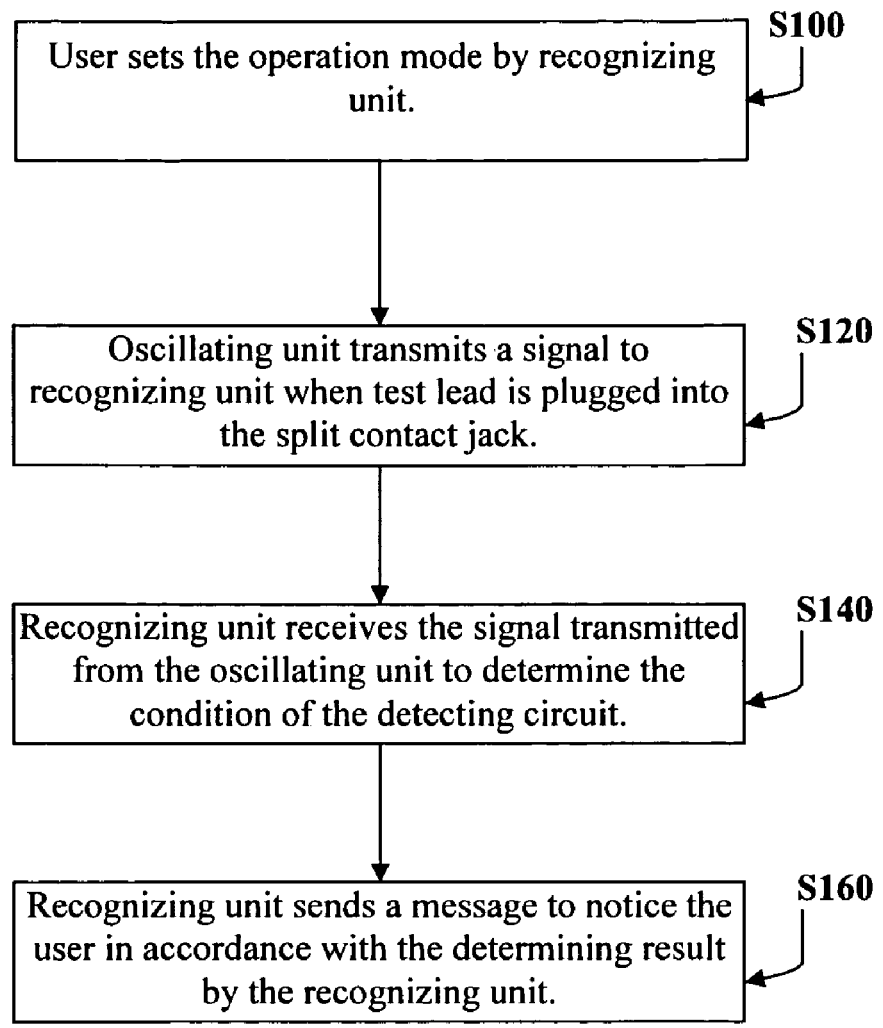
FIG. 3 is a flow chart illustrating the plugged test lead detecting method in accordance with the present invention.

Referring to FIG. 3, it illustrates the detecting method in accordance with an embodiment of present invention. Firstly, a user sets an operation mode of a detecting circuit 100 with a plugged test lead though a recognizing unit 112 in the step 110. The operation mode of the detecting circuit 100 includes a test lead detecting mode, a fuse open detecting mode, and a current measurement mode. The user can select one operation mode according to the need for the user.

The user sets the operation mode of the detecting circuit 100 through the recognizing unit 112. Whether the test lead is plugged in the split contact jack 106 or not, the oscillating unit 110 can transmit the signal to the recognizing unit 112 in any operation mode in the step 120. The oscillating circuit 110 stops oscillating and outputs a quiescent state voltage to the recognizing unit 112 when the user plugs the test lead into the split contact jack 106. Conversely, when the test lead does not plug into the split contact jack 106, the contact plate 114 does not couple to the contact plate 116 to form an open state, and the oscillating unit 110 generates a pre-determined frequency pulse to the recognizing unit 112.

The recognizing unit 112 receives the signal generated by the oscillating unit 110, and determines the condition of the detecting circuit 100 according to the operation mode set by the user in the step 140. The oscillating pulse or quiescent state voltage received by the recognizing unit 112 has different meanings at various operation modes. For instance, when the user sets the operation mode of the detecting circuit 100 through the recognizing unit 112 as the test lead detecting mode, the oscillating unit 110 transmits the quiescent state voltage to the recognizing unit 112. If the user plugs the test lead into the split contact jack 106, and the recognizing unit 112 receives the quiescent state voltage from the oscillating unit 110, then the recognizing unit 112 determines the result that the user plugs the test lead into the split contact jack 106 in error and reminds the user that do not plug the test lead into the split contact jack 106 in the step 160.

For example, when the operation mode of the detection circuit 100 is the current measurement mode, the oscillating unit 110 transmits the oscillating signal to the recognizing unit 112 if the test lead does not plug in the split contact jack 106. The recognizing unit 112 receives the oscillating signal from the oscillating unit 110 to determine that the fuse 104 is blown or the user does not plug the test lead into the split contact jack 106, and the recognizing unit 112 sends a message to remind that the user plugs the test lead into the split contact jack 106 or checks whether the fuse 104 is blown or not in the step 160. For another example, when the operation mode of the detecting circuit 100 is the fuse open detection mode, the oscillating unit 110 transmits the oscillating signal to the recognizing unit 112 if the test lead is plugged into the split contact jack 106. The recognizing unit 112 receives the signal from the oscillating unit 110 to determine that the fuse 104 is open or blown, and the recognizing unit 112 sends a message to remind the user so as to replace the fuse in the step 160.

Figure 4:
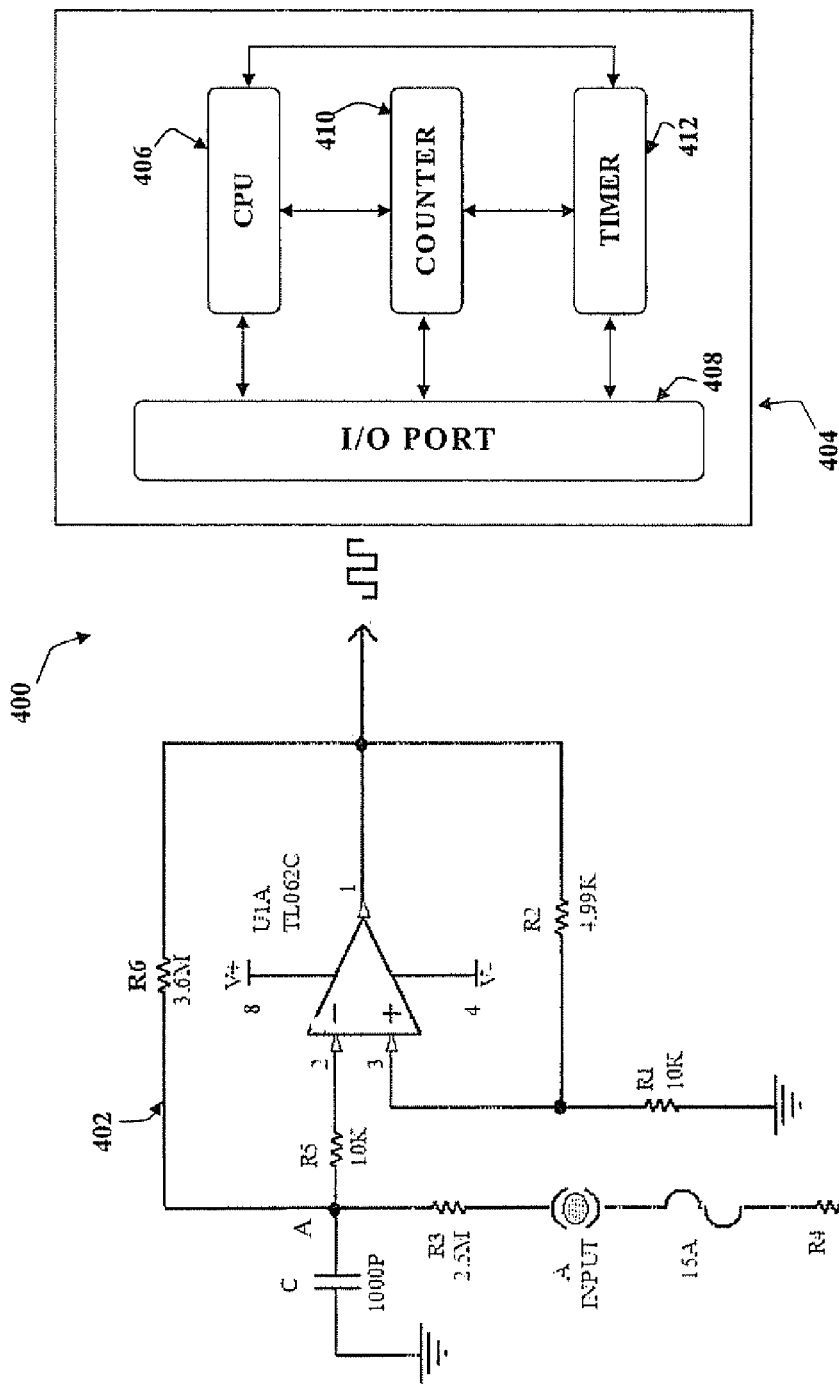
FIG. 4 illustrates an example of the test lead detecting circuits and the method using the same in accordance with the present invention.

As seen in FIG. 4, it illustrates an example of the plugged test lead detecting circuit and the method using the same in accordance with an embodiment of the present invention. An application circuit 400 includes a resistor R4 with an extremely little resistance connected to ground, the resistance of the resistor R4 is negligible in comparison with the resistance of the resistor R3. A fuse F (maximum tolerant current 15 ampere) is connected to the resistor R4 in series to prevent the over-current flowing into the resistor R4 through the fuse F. A split contact jack A-INPUT has two contact plates, an upper contact plate and lower contact plate. The lower contact plate is coupled to ground through the series circuit formed by the fuse F and the resistor R4, and the upper contact plate is coupled to the resistor R3. The resistor R3 has a high resistance for preventing an unexpected high voltage applying to the split jack A-INPUT. The application circuit 400 also comprises an oscillating circuit 402 coupled to a resistor R3. The oscillating circuit 402 includes an operational amplifier (TL062), resistors R1, R2, R5, R6, and a capacitor C. The output oscillating signal is generated by charging and discharging alternatively on the resistor R6 and the capacitor C. The application circuit 400 also comprises a recognizing unit 404 coupled to the output terminal (the terminal 1 of the operational amplifier) of the oscillating circuit 402. The recognizing unit 404 includes a central processing unit 406 used to determine the condition of the detecting circuit 400; a input/output port (I/O port) 408 to be a channel for the central processing unit 406 communicating with outside device; a counter 410 for counting the duty cycle of output signal generated from the oscillating circuit 402, and storing the output state of the oscillating circuit 402, and transmitting the information counted from the counter 410 to the central processing unit 406 through the I/O port 120; a timer 412 used to pre-set a set time. The timer 412 stops counting when the set time is reached, and then transmits a message to the central processing unit 406 through the I/O port 408.

Table 1 shows the various parameters of the oscillation circuit 402 in FIG. 4:

|  | Standard TYPICAL | C + 10% R6 + 5% R1 + 1% R2 − 1% MIN | C − 10% R6 − 5% R1 − 1% R2 + 1% MAX |
|---|---|---|---|
| C | 1.00E−09 F. | 1.10E−09 F. | 9.00E−10 F. |
| R6 | 3.60E+06 Ω | 3.96E+06 Ω | 3.24E+06 Ω |
| R1 | 1.00E+04 Ω | 1.10E+04 Ω | 9.00E+03 Ω |
| R2 | 4.99E+03 Ω | 4.94E+03 Ω | 5.04E+03 Ω |
| Frequency, f | 86.21071054 Hz | 67.670177 Hz | 112.8195 Hz |
| Maximum f | 67.670177 Hz |  |  |
| Minimum f | 112.81952 Hz |  |  |

The frequency in table 1 can be solved by a typical formula of oscillating frequency.

Figure 5:
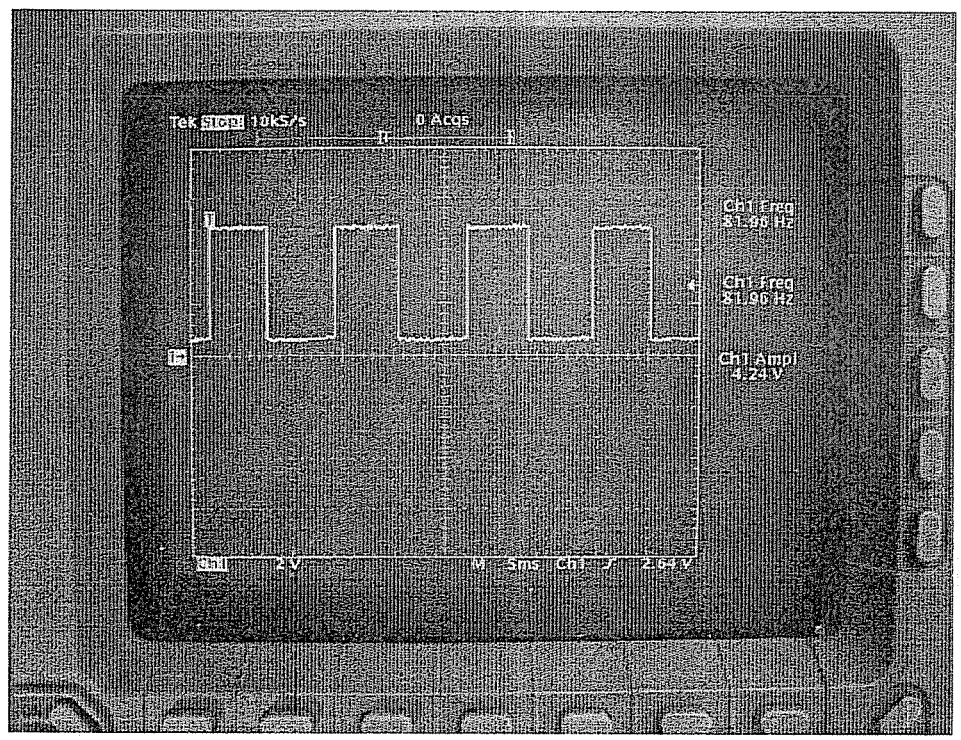
FIG. 5 is an oscillogram with an expected frequency generated by the oscillating circuits according to FIG. 4.

Turning to FIG. 4, firstly, when the test lead does not plug in the split contact jack A-INPUT, the upper contact plate and lower contact plate are not to be coupled together such that the path between the series circuit formed by the fuse F and the resistor R4, and the series circuit formed by the upper contact plate coupled to the resistor R3 is open. Therefore, current generated by the oscillation circuit 402 does not flow through the series circuit formed by the resistor R3, the split contact jack A-INPUT, the fuse F and the resistor R4 coupled to ground. Thus, the oscillating circuit 402 generates a predetermined frequency pulse to the recognizing unit 404, for example, the waveform shown in FIG. 5.

Figure 6:
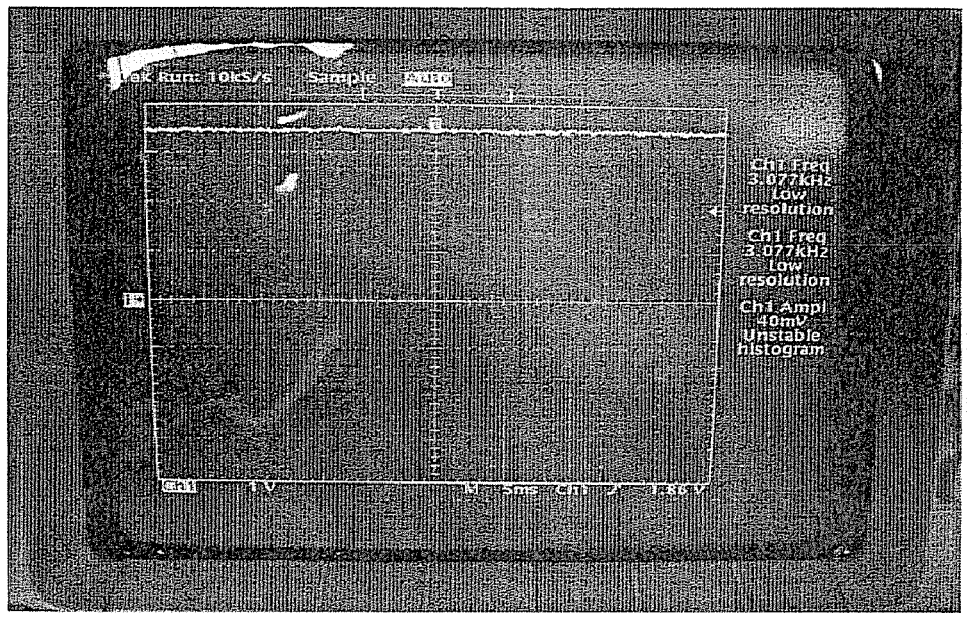
FIG. 6 is an oscillogram with a quiescent state voltage generated by the oscillating circuits according to FIG. 4.
Figure 6:
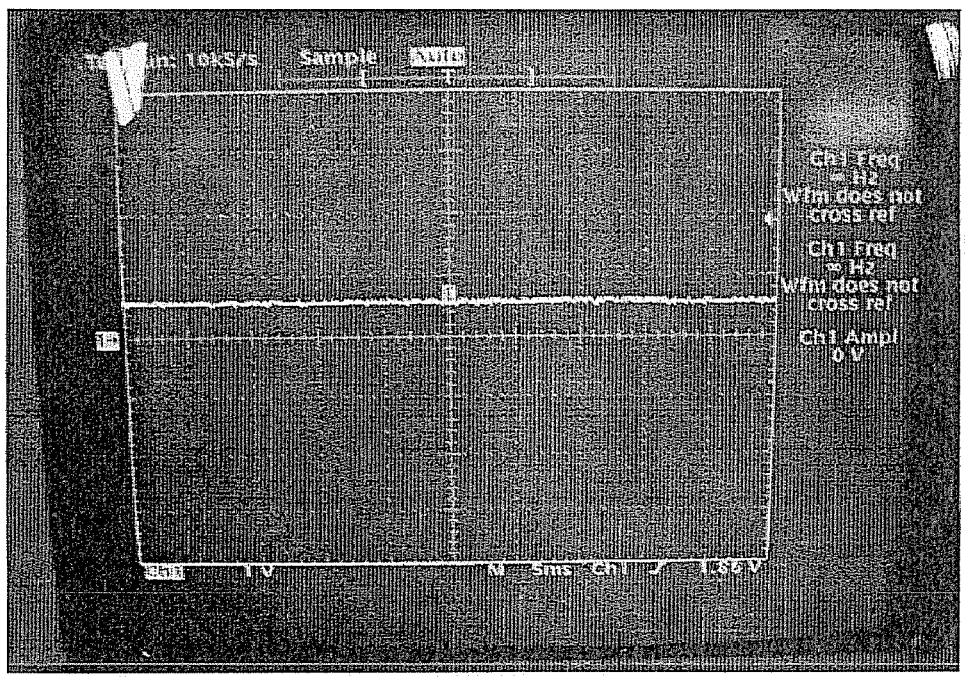

When the test lead is plugged into the split contact jack A-INPUT, the test lead bridges the upper contact plate and lower contact plate to form an electrical path through the series circuit formed by the resistor R3, the fuse F and the R4 coupled to ground. The current flowing from the output terminal(terminal 1) of the operational amplifier via the resistor R6 to capacitor C will flow to the series circuit formed by the resistor R3, the split contact jack A-INPUT, the fuse F and the resistor R4 coupled to ground. Thus, the capacitor C stops being charged and discharged alternatively to hold the same potential as a node A. The oscillating circuit 402 stops oscillating, and outputs a quiescent state voltage to the recognizing unit 404. The quiescent state voltage can be termed as a high level or a low level, shown as the waveform in FIG. 6.

The recognizing unit 404 receives the signal (oscillating signal or the quiescent state output) from the oscillating circuit 402 to recognize the state of the oscillating circuit 402. The central processing unit 406 determines oscillating status and the frequency, the pulse width or duty cycle of the oscillating circuit 402 according to the test lead plugged in the split contact jack A-INPUT or not.

For example, the central processing unit 406 pulling the oscillating signal is shown as follows:

1. Setting the time per 6.6 ms to pull the output signal from the oscillating circuit 402.
2. Setting by the timer 412 for 264 ms.
3. Initializing the timer 412, and setting initial state of the counter 410 to zero, and storing the output state of the oscillating circuit 402 to the counter 410.
4. Pulling the output signal from the oscillating circuit 402 per 6.6 ms, thereby the counter 410 increases one transient output, and stores the output state.
5. The timer 412 is performed to reach the setting time to determine the condition of the counter 410;
   a. The counter>1 means that the test lead does not plug into the split contact jack A-INPUT.
   b. The counter≦1 means the test lead plugged into the split contact jack A-INPUT.
6. Backing to the steps 3-5 for cycling pulling.

It will be appreciated to those skilled in the art that the preceding examples and preferred embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention.

We claim:

1. A detecting method of a detecting circuit with a plugged test lead, comprising:
   setting an operation mode of said detecting circuit by a recognizing unit;
   transmitting a signal to said recognizing unit by an oscillating unit when said test lead plugs or unplugs into a split contact jack;
   receiving said signal from said oscillating unit by said recognizing unit, and determining a condition of said detecting circuit; and sending a message to a user in accordance with said determining result of said recognizing unit
wherein said oscillating unit is stopped from oscillating and outputs a quiescent state voltage to said recognizing unit when said plugged test lead is inserted into said split contact jack.

2. The method of claim 1, wherein said operation mode of said detecting circuit includes a test lead detecting mode, a fuse open detecting mode and a current measurement mode.

3. The method of claim 1, wherein said oscillating unit generates a pre-determined frequency pulse to said recognizing unit when said test lead is unplugged into said split contact jack.

4. The method of claim 1, wherein said operation mode of said plugged test lead detecting circuit comprises a test lead detecting mode, and said recognizing unit sends the message to notice the user without inserting said test lead into said split contact jack.

5. The method of claim 1, wherein said operation mode of said plugged test lead detecting circuit comprises a current measurement mode, said oscillating unit transmits a oscillating signal to said recognizing unit when said test lead is unplugged from said split contact jack, and said recognizing unit sends the message to notice the user inserting said test lead into said split contact jack or checking if a fuse is open or blown.

6. The method of claim 1, wherein said operation mode of said plugged test lead detecting circuit comprises a fuse open detecting mode, and when said test lead is plugged into said split contact jack, said oscillating unit transmits the oscillating signal to said recognizing unit, said recognizing unit receives said oscillating signal from said oscillating unit to determine if said fuse is open or blown, and said recognizing unit sends the message to notice the user to replace said fuse.

* * * * *